(12) United States Patent
Hsu et al.

(10) Patent No.: US 8,687,181 B2
(45) Date of Patent: Apr. 1, 2014

(54) METHOD AND APPARATUS FOR TESTING LIGHT-EMITTING DEVICE

(75) Inventors: Chia-Liang Hsu, Hsinchu (TW); Chih-Chiang Lu, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 106 days.

(21) Appl. No.: 13/365,820

(22) Filed: Feb. 3, 2012

(65) Prior Publication Data

US 2013/0201483 A1    Aug. 8, 2013

(51) Int. Cl.
*G01J 1/42* (2006.01)
(52) U.S. Cl.
USPC ........................................ 356/218; 356/237.1
(58) Field of Classification Search
USPC ............ 356/237.1–237.5, 213–236; 382/149, 382/145; 324/750, 753; 257/79
See application file for complete search history.

(56) References Cited

U.S. PATENT DOCUMENTS

| | | | | |
|---|---|---|---|---|
| 5,757,193 A | * | 5/1998 | Yu et al. | 324/501 |
| 7,812,624 B1 | * | 10/2010 | Wei et al. | 324/762.07 |
| 8,068,661 B2 | * | 11/2011 | Onushkin et al. | 382/141 |
| 2002/0003428 A1 | * | 1/2002 | Freund et al. | 324/750 |
| 2003/0047736 A1 | * | 3/2003 | Hayashi et al. | 257/79 |
| 2005/0088380 A1 | * | 4/2005 | Bulovic et al. | 345/77 |
| 2006/0192574 A1 | * | 8/2006 | Furukawa et al. | 324/750 |
| 2007/0211463 A1 | * | 9/2007 | Chevalier et al. | 362/249 |
| 2009/0117672 A1 | * | 5/2009 | Caruso et al. | 438/7 |
| 2009/0136120 A1 | * | 5/2009 | Onushkin et al. | 382/149 |
| 2010/0156778 A1 | * | 6/2010 | Yamagishi | 345/102 |
| 2010/0246936 A1 | * | 9/2010 | Ji et al. | 382/149 |
| 2012/0105836 A1 | * | 5/2012 | Yoon et al. | 356/244 |
| 2012/0122250 A1 | * | 5/2012 | Ji et al. | 438/15 |
| 2012/0280940 A1 | * | 11/2012 | Murai et al. | 345/175 |

* cited by examiner

*Primary Examiner* — Hoa Pham
(74) *Attorney, Agent, or Firm* — Patterson & Sheridan, LLP

(57) ABSTRACT

Disclosed is a method for testing a light-emitting device comprising the steps of: providing a light-emitting device comprising a plurality of light-emitting diodes; driving the plurality of the light-emitting diodes with current; generating an image of the light-emitting device; and determining a luminous intensity of each of the light-emitting diodes with the image. An apparatus for testing a light-emitting device comprising a plurality of light-emitting diodes is also disclosed. The apparatus comprises: a current source to provide a current to drive the plurality of the light-emitting diodes; an image receiving device for receiving an image of the light-emitting device in the driven state; and a processing unit for determining a luminous intensity of each of the light-emitting diodes with the image.

18 Claims, 4 Drawing Sheets

METHOD AND APPARATUS FOR TESTING LIGHT-EMITTING DEVICE

TECHNICAL FIELD

The application relates to a method and apparatus for testing a light-emitting device.

DESCRIPTION OF BACKGROUND ART

As the technology of the light-emitting diodes (LEDs) develops, the light-emitting diodes are applied widely. And now a light-emitting device adopting the light-emitting diode usually comprises more than one single light-emitting diode. For example, the light-emitting device such as a High Voltage Light-Emitting Diode (HVLED), an Alternating Current Light-Emitting Diode (ACLED), or an Array that is commonly used as a display, a traffic sign, and a lighting, etc., comprises a plurality of light-emitting diodes. Taking the HVLED as an example, as a single light-emitting diode works at a low voltage, the HVLED is formed by a plurality of light-emitting diodes connected in series. FIG. 1 shows an HVLED. The externally supplied AC voltage 11 is reduced in its voltage level by a converter 12 and converted into a DC voltage corresponding thereto. Then the converted DC voltage is fed into a plurality of light-emitting diodes. As shown in FIG. 1, to form the HVLED, a light-emitting diode is connected with one another in series. And then each series is connected in parallel with other series. This can be done by a chip level design to layout the plurality of light-emitting diodes in a single chip, or by a package level to have the plurality of light-emitting diodes in a package. However, some types of failures caused by the manufacturing process or material defects, such as the current leakage in a small local area or a surface stain/damage which causes the light shaded, cannot be detected by a conventional electrical test. For a light-emitting device comprises a plurality of light-emitting diodes connected in series and/or parallel, if only a few light-emitting diodes fail, it is difficult to be detected by a conventional electrical test. Besides, the uniformity of the luminous intensity of the plurality of light-emitting diodes which often concerns the application cannot be measured in the conventional electrical test as well.

SUMMARY OF THE DISCLOSURE

Disclosed is a method for testing a light-emitting device comprising the steps of: providing a light-emitting device comprising a plurality of light-emitting diodes; driving the plurality of the light-emitting diodes with current; generating an image of the light-emitting device; and determining a luminous intensity of each of the light-emitting diodes with the image. An apparatus for testing a light-emitting device comprising a plurality of light-emitting diodes is also disclosed. The apparatus comprises: a current source to provide a current to drive the plurality of the light-emitting diodes; an image receiving device for receiving an image of the light-emitting device in the driven state; and a processing unit for determining a luminous intensity of each of the light-emitting diodes with the image.

DETAILED DESCRIPTION OF PREFERRED EMBODIMENTS

The light-emitting device to be tested in the present application comprises a plurality of light-emitting diodes. The plurality of light-emitting diodes may be formed in a series connection, a parallel connection, or both series and parallel connection. The light-emitting device may be in a variety of forms. For example, the light-emitting device to be tested may be at a chip level (or wafer level) or a package level. For the light-emitting device at a chip level, the light-emitting device can be a chip having one light-emitting diode, or a chip comprises multiple light-emitting diodes monolithically integrated together. For the light-emitting device at a wafer level, the light-emitting device is in a wafer form with a plurality of light-emitting diodes, wherein the wafer can be separated later to form multiple chips which each contains one or more light-emitting diodes by dicing. For the light-emitting device at a package level, the light-emitting device can be one package containing one or more chips which are electrically connected together in such package, or multiple individually packaged chips which are electrically connected to form the light-emitting device.

Figure 1:
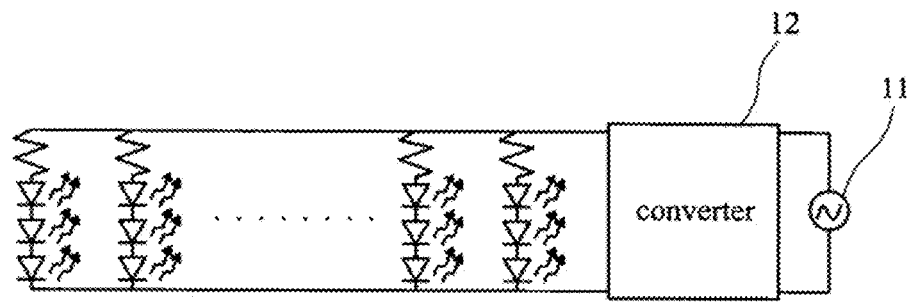
FIG. 1 illustrates a circuit diagram of a conventional HVLED.
Figure 2:
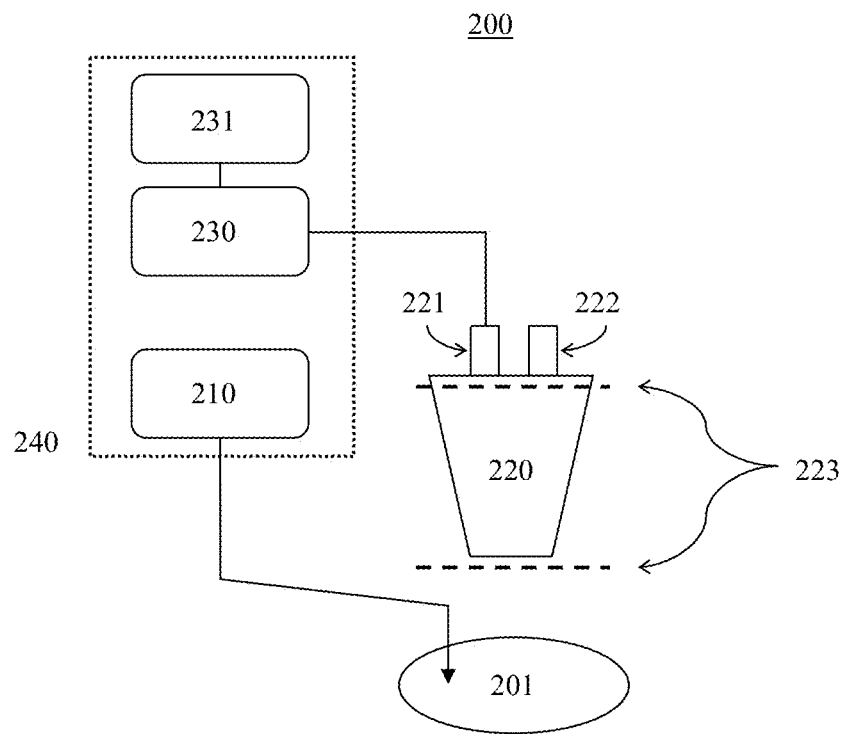
FIG. 2 illustrates an apparatus for testing a light-emitting device comprising a plurality of light-emitting diodes in accordance with one embodiment of the present application.

FIG. 2 illustrates an apparatus for testing a light-emitting device comprising a plurality of light-emitting diodes in accordance with an embodiment of the present application. The apparatus 200 comprises a current source 210, an image receiving device 220, and an image processing unit 230. The light-emitting device to be tested 201 (or Device Under Test, herein after DUT 201) is placed under the image receiving device 220, and the current source 210 provides a current to the DUT 201 for driving the plurality of the light-emitting diodes. Each of the plurality of the light-emitting diodes emits a light in the driven state. The image receiving device 220 receives an image of the DUT 201 in the driven state, and the image processing unit 230 determines a luminous intensity of each of the light-emitting diodes according to the image received by the image receiving device 220.

The image receiving device 220 may comprises a microscope which magnifies the image of the DUT 201 when it is received. The image receiving device 220 may further comprise an image sensor 221, such as a CCD (Charge-coupled Device) or a CMOS image sensor to capture the image of the DUT 201. The image sensor 221 may be placed abreast of an eyepiece 222 of the image receiving device 220, so that the image received can be observed from the eyepiece 222 of the image receiving device 220 by an operator with his eyes and/or be captured simultaneously by the image sensor 221 with the signals of the image being transferred to the image processing unit 230 for further processes or determination. When the image is observed from the eyepiece 222 of the image receiving device 220 by an operator with his eyes, the operator determines the luminous intensity of each of the light-emitting diodes. When the image is captured by the image sensor 221, the signals of the image are transferred to the image processing unit 230. After further processes such as analog to digital conversion (ADC) by the image processing unit 230, a gray level value for each of the light-emitting diodes may be obtained to represent and be determined as the luminous intensity of each of the light-emitting diodes. The gray level is usually divided into a number of levels of an exponent of 2 (i.e. $2^n$). Generally, 256 ($=2^8$) levels are used to represent the gray level. The apparatus 200 may further comprise a comparing unit 231 to compare the luminous intensity indicated by the gray level value of each of the light-emitting diodes with a pre-determined luminous intensity to determine whether the light-emitting diode is a defective light-emitting diode or not. The pre-determined luminous intensity, for example, may be pre-determined from some statistic data, such as the average of the luminous intensities indicated by the gray level values of good light-emitting diodes. The image receiving device 220 may further comprises a filter 223 for filtering off a specific range of the wave length of a light. This is useful when the difference between the luminous intensity of this defective light-emitting diode and the luminous intensity of other good light-emitting diodes is minor and not discriminable. The filter 223 filters off a specific range of the wave length of a light and therefore makes the difference between the luminous intensity of this defective light-emitting diode and the luminous intensity of other good light-emitting diodes large enough to be discriminable. The filter 223 may be set between the DUT 201 and the image receiving device 220, or between the image receiving device 220 and the image sensor 221 and the eyepiece 222. Furthermore, the image processing unit 230 and the comparing unit 231 may be assembled in the automated equipment 240 such as a computer. In addition, the current source 210 may be assembled in the same automated equipment 240 so the image processing unit 230, the comparing unit 231, and the current source 210 may be controlled and coordinated for operation by, for example, a computer program.

Figure 3:
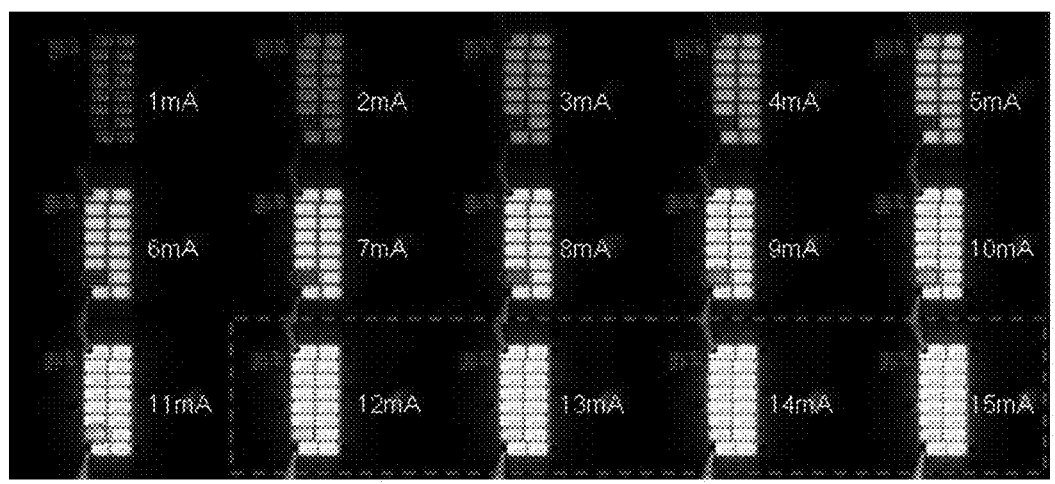
FIG. 3 illustrates an actual image of a light-emitting device captured by a CCD in accordance with one embodiment of the present application.

The current source 210 provides a current to the DUT 201 for driving the plurality of the light-emitting diodes, and the magnitude of the current provided can have a substantially constant value or a variant value. Each of the plurality of the light-emitting diodes emits a light in the driven state. FIG. 3 shows an actual image of a light-emitting device as the DUT 201 captured by the image sensor 221. In this example, the DUT 201 comprises 16 light-emitting diodes arranged in 2 columns where each column has 8 light-emitting diodes. All the 16 light-emitting diodes are connected in series. In one embodiment, the magnitude of the current provided by the current source 210 is increased with time from a small value to a large value, for example, from 1 mA to 15 mA. As shown in the figure, as the current provided increases, the luminous intensity of each of the light-emitting diodes becomes larger. It is noticed that one (the second one from the bottom in the left column, marked by an ellipse) of the light-emitting diodes has less luminous intensity compared with the others, especially when the current is from about 6 mA to about 11 mA. This indicates the darker light-emitting diode is defective due to the current leakage. However, when the current provided is larger than 11 mA, i.e. from 12 mA to 15 mA, the difference of the luminous intensity between this defective light-emitting diode and the others is not that obvious to differentiate. This is because the current leakage is in a small and local area. As the current provided increases, both the leakage current and the operating current increase, but the increasing rate of the leakage current is smaller than the increasing rate of the operating current. When the current provided is large enough, for example, when the current is from 12 mA to 15 mA, the leakage current contributes only a small percentage of the operating current, and the difference of the luminous intensity between the defective light-emitting diode and the others becomes minor and not so discriminable. In the above embodiment, the current sufficient to identify the defective light-emitting diode is from about 6 mA to about 10 mA. Taking the current of 10 mA as an example, if the area of the DUT 201 is about 1 mm$^2$, the current density of each of the light-emitting diodes in this light-emitting device is about 160 mA/mm$^2$ (i.e. 10 mA/(1 mm$^2$/16)). For most light-emitting devices, a current density smaller than or equal to about 300 mA/mm$^2$ is small enough to differentiate the defective light-emitting diode. In an alternative embodiment, the current may be with a substantially constant value, and the current density smaller than or equal to about 300 mA/mm$^2$ is small enough to screen out the defect. In a conventional electrical test, the current provided to the light-emitting device is usually the operation current of the light-emitting diode, and the leakage is usually not detected. Besides, even the current provided to the light-emitting device in a conventional electrical test is set to a small current such that the current density of each of the light-emitting diodes is smaller than the operation current density, because the current leakage normally happens in a small and local area and does not construe an open circuit, it is not easy to detect defect like leakage in a conventional electrical test. In contrast, with the luminous intensity of each of the light-emitting diodes of the image, the defect like leakage can be easily detected.

Figure 4A:
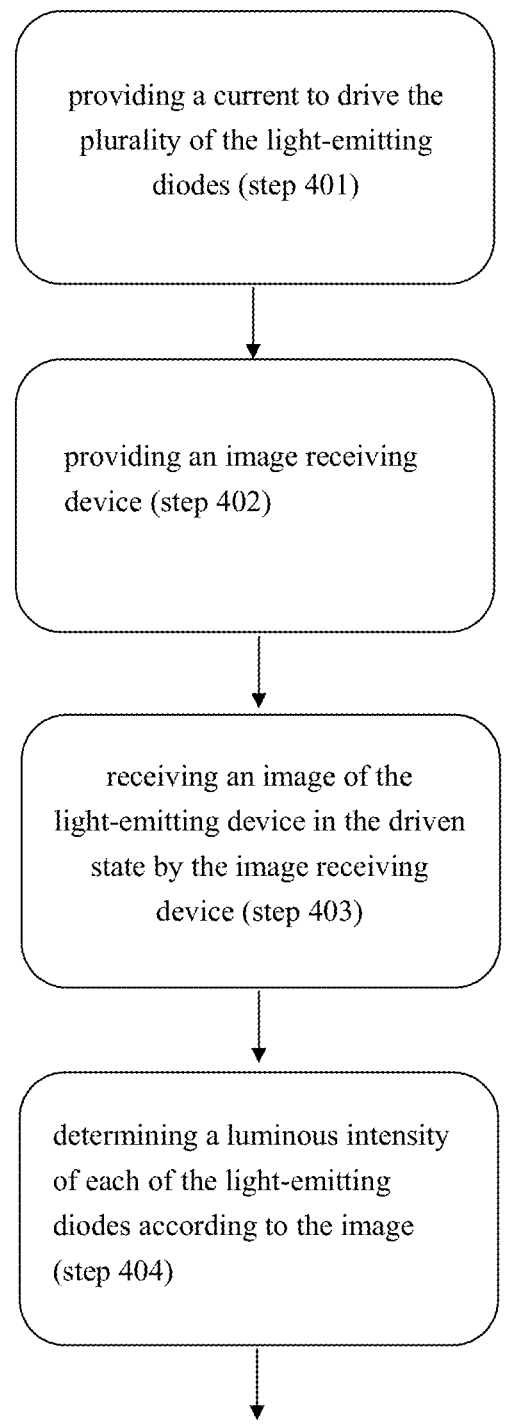
FIG. 4A illustrates a method for testing a light-emitting device comprising a plurality of light-emitting diodes in accordance with another embodiment of the present application.

FIG. 4A illustrates a method for testing a light-emitting device comprising a plurality of light-emitting diodes in accordance with another embodiment of the present application. The light-emitting device to be tested comprises a plurality of light-emitting diodes, and is as those noted and illustrated above in the above-mentioned.

The method may be carried out with the utilization of the apparatus as previously illustrated. The method comprises: providing a current to drive the plurality of the light-emitting diodes (step 401); providing an image receiving device (step 402); receiving an image of the light-emitting device in the driven state by the image receiving device (step 403); and determining a luminous intensity of each of the light-emitting diodes according to the image (step 404). In the step 401, a current is provided to the light-emitting device for driving the plurality of the light-emitting diodes, wherein the magnitude of the current has a substantially constant value or a variant value. Each of the plurality of the light-emitting diodes emits a light in the driven state. In one embodiment, the current provided has a variant value, and the current is increased with time. In an alternative embodiment, the current has a substantially constant value. In both embodiments, the current density of each of the light-emitting diodes is smaller than or equal to about 300 mA/mm$^2$.

In the step 402, the image receiving device may be a microscope, and may further comprise a filter for filtering off a specific range of the wave length of light. In the step 403, an image of the light-emitting device in the driven state is received by the image receiving device. In the step 404, a luminous intensity of each of the light-emitting diodes in the light-emitting device is determined according to the image by, for example, an operator observing from the eyepiece of the image receiving device with his eyes. In one embodiment, the image receiving device may further comprise an image sensor, such as a CCD or a CMOS image sensor, to capture the image of the light-emitting device. The image sensor may be placed abreast of the eyepiece of the image receiving device so the image received can be captured simultaneously by the image sensor, and the signals of the image are transferred to an image processing unit for further processes or determination. That is, the image processing unit may be assembled in an automated equipment, such as a personal computer, and in the step 404, the determining of the luminous intensity of each of the light-emitting diodes according to the image may also be performed by the automated equipment. After further processes of the signals of the image by the image processing unit, such as analog to digital conversion (ADC), a gray level value for each of the light-emitting diodes may be obtained to represent and be determined as the luminous intensity of each of the light-emitting diodes. With the method carried out by the automated equipment, it is easier to provide a current with a variant value to the light-emitting device, and the current is increased from a small value to a large value with time and the luminous intensity is correspondingly determined. These can be easily carried out by the automated equipment with a computer program comprising a loop, with the current being controlled to provide a different current value in the different execution of the loop.

Figure 4B:
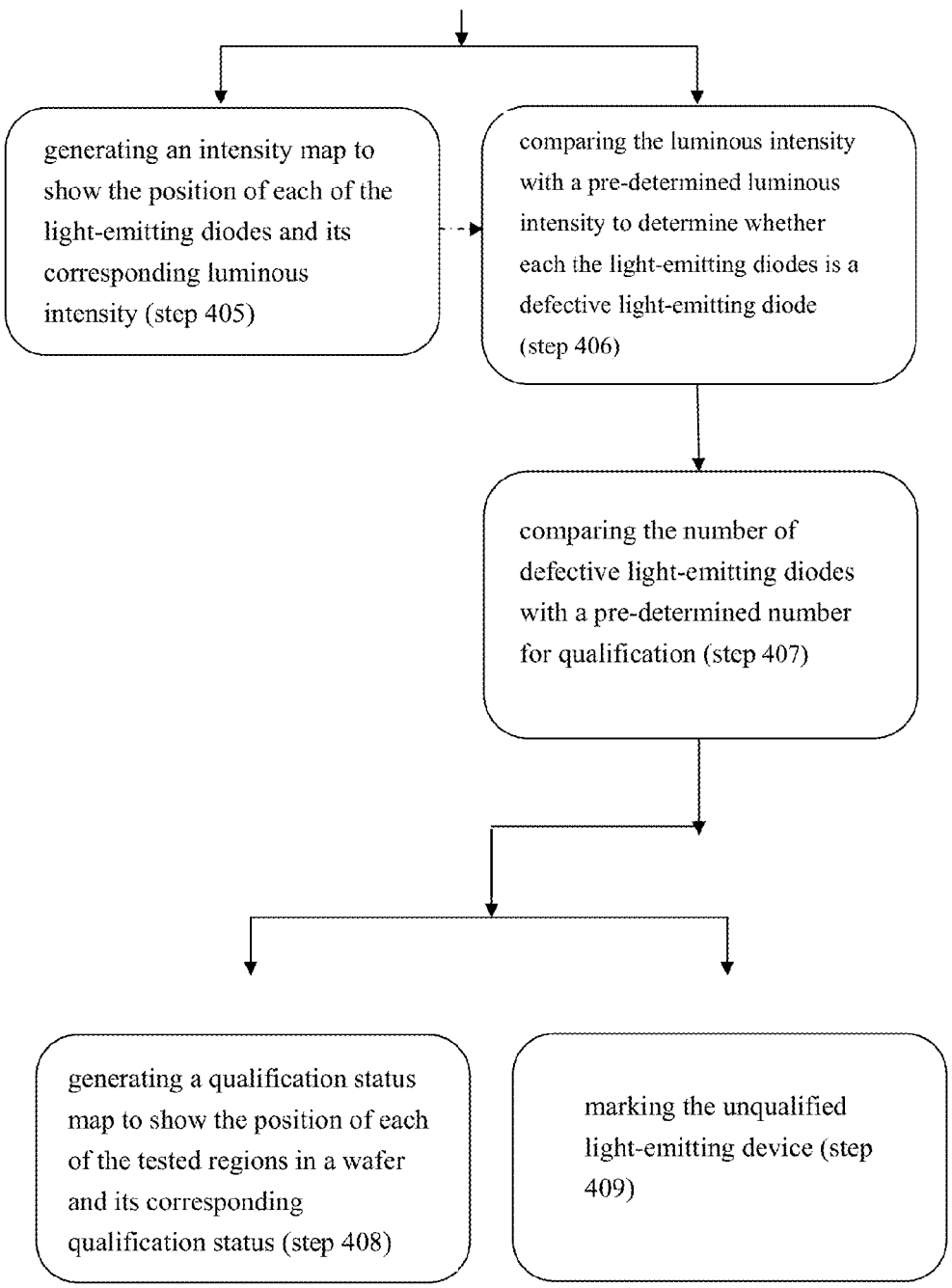
FIG. 4B illustrates further steps which the method illustrated in FIG. 4A may comprise in accordance with another embodiment of the present application.

As shown in FIG. 4B, the method may further comprise other steps. For example, the gray level value for each of the light-emitting diodes may be optionally used to generate an intensity map to show the position of each of the light-emitting diodes and its corresponding luminous intensity, as shown in the step 405. The intensity map can also be outputted to a computer monitor for the operator to compare the luminous intensity indicated by the gray level value with a pre-determined luminous intensity to determine whether a light-emitting diode is a defective light-emitting diode or not, as shown in the step 406. Or as an alternative, in the step 406, the automated equipment may further comprise a comparing unit, and the comparing unit compares the luminous intensity indicated by the gray level value of each of the light-emitting diodes with a pre-determined luminous intensity to determine whether a light-emitting diode is a defective light-emitting diode or not. The pre-determined luminous intensity can be collected from statistic data, such as the average of the luminous intensities indicated by the gray level value of good light-emitting diodes.

Then, the method may further comprise the step 407 to compare the number of defective light-emitting diodes with a pre-determined number for qualification. For example, normally only one or two defective light-emitting diodes in a light-emitting device is acceptable. In such case, the pre-determined number is set as 3. Similarly, this step 407 can be performed by the operator or by the automated equipment with a computer program. When the light-emitting device is at wafer level, the whole wafer can be loaded to be tested. After testing, the method may further comprises an optional step 408 to generate a qualification status map showing the position of the tested regions in the wafer and its corresponding qualification status, wherein the qualification status comprises a qualified status or an unqualified status.

The method may further comprise the step 409 to mark the unqualified light-emitting device. And when the luminous intensity is determined automatically by an automated equipment in step 404, step 406, and step 407, a reconfirmation procedure is performed by the operator with eyes from the eyepiece of the image receiving device. The reconfirmation procedure can also performed at the same time when the automated equipment detects an unqualified light-emitting device and alarms and pauses to wait for the instruction from the operator, or the reconfirmation procedure can be made later after the whole wafer is tested. Similarly, in the step 406, when the comparing is performed by the automated equipment (the comparing unit) and a defective light-emitting diode is detected, a reconfirmation procedure may be set to be conducted by the operator in the same way illustrated as the above. Besides, the intensity map generated in the step 405 and the qualification status map generated in the step 408 may be stored in the automated equipment for the quality control or the engineering analysis in the future. In addition, the uniformity of the luminous intensity of the plurality of light-emitting diodes which often concerns the application but can not be measured in the conventional electrical test can be obtained by this method. The intensity map generated in the step 405 clearly shows the position of each of the light-emitting diodes and its corresponding luminous intensity indicated by the gray level value, and the uniformity may be calculated based on these data and be monitored.

The foregoing description has been directed to the specific embodiments of this invention. It will be apparent; however, that other alternatives and modifications may be made to the embodiments without escaping the spirit and scope of the application.

What is claimed is:

1. A method for testing a light-emitting device comprising the steps of:
   providing a light-emitting device comprising a plurality of light-emitting diodes;
   driving the plurality of the light-emitting diodes with current;
   generating an image of the light-emitting device;
   determining a luminous intensity of each of the light-emitting diodes with the image; and
   comparing the luminous intensity of each of the light-emitting diodes with a pre-determined luminous intensity for determining whether each of the light-emitting diodes is a defective light-emitting diode or not.

2. The method as claimed in claim 1, wherein the magnitude of the current is a substantially constant value with the current density of each of the light-emitting diodes smaller than or equal to about 300 mA/mm2.

3. The method as claimed in claim 1, wherein the magnitude of the current is a variant value and is increased with time.

4. The method as claimed in claim 1, wherein the luminous intensity is determined according to a gray level of the image.

5. The method as claimed in claim 1, wherein the step of generating the image of the light-emitting device comprises providing an image receiving device and receiving the image of the light-emitting device from the image receiving device.

6. The method as claimed in claim 5, wherein the image receiving device is a microscope.

7. The method as claimed in claim 5, wherein the image receiving device further comprises an image sensor to capture the image of the light-emitting device.

8. The method as claimed in claim 5, wherein the image receiving device further comprises a filter for filtering off a specific range of the wave length of light.

9. The method as claimed in claim 1, wherein the step of determining the luminous intensity of each of the light-emitting diodes with the image is performed manually by a human being with eyes.

10. The method as claimed in claim 1, wherein the step of determining the luminous intensity of each of the light-emitting diodes with the image is performed automatically by an automated equipment.

11. The method as claimed in claim 1, further comprising generating an intensity map showing the position of each of the light-emitting diodes and its corresponding luminous intensity.

12. The method as claimed in claim 1, further comprising comparing the number of defective light-emitting diodes with a pre-determined number for determining whether the light-emitting device is qualified or not.

13. The method as claimed in claim 12, further comprising testing the light-emitting device of a wafer form; and generating an qualification status map showing the position of tested area in the wafer and its qualification status, wherein the qualification status comprises a qualified status or an unqualified status.

14. The method as claimed in claim 12, further comprising marking the unqualified light-emitting device and/or when the luminous intensity is determined automatically by an automated equipment, reconfirming the unqualified light-emitting device manually by a human being with eyes.

15. The method as claimed in claim 1, wherein the plurality of light-emitting diodes is monolithically formed as a chip.

16. The method as claimed in claim 1, wherein the plurality of light-emitting diodes is connected in series, parallel, or both series and parallel.

17. An apparatus for testing a light-emitting device comprising a plurality of light-emitting diodes comprising:
  a current source to provide a current to drive the plurality of the light-emitting diodes;
  an image receiving device for receiving an image of the light-emitting device in the driven state;
  a processing unit for determining a luminous intensity of each of the light-emitting diodes with the image; and
  a comparing unit to compare the luminous intensity of each of the light-emitting diodes with a pre-determined luminous intensity for determining whether each of the light-emitting diodes is a defective light-emitting diode or not.

18. The apparatus as claimed in claim 17, wherein the image receiving device further comprises a filter for filtering off a specific range of the wave length of light.

* * * * *